(12) United States Patent
Katsuno et al.

(10) Patent No.: US 6,278,227 B1
(45) Date of Patent: Aug. 21, 2001

(54) PIEZOELECTRIC TRANSFORMER

(75) Inventors: Masafumi Katsuno, Sendai; Yoshiaki Fuda, Natori, both of (JP)

(73) Assignee: Tokin Corporation, Miyagi (JP)

( * ) Notice: Subject to any disclaimer, the term of this patent is extended or adjusted under 35 U.S.C. 154(b) by 0 days.

(21) Appl. No.: 09/496,926

(22) Filed: Feb. 2, 2000

Related U.S. Application Data

(63) Continuation of application No. PCT/JP97/00207, filed on Jan. 30, 1997.

(30) Foreign Application Priority Data

| Jan. 30, 1996 | (JP) | ................................................ 8-13564 |
| Oct. 4, 1996 | (JP) | ................................................ 8-264024 |
| Oct. 22, 1996 | (JP) | ................................................ 8-299344 |
| Nov. 22, 1996 | (JP) | ................................................ 8-311595 |

(51) Int. Cl.$^7$ .................................................. H01L 41/08
(52) U.S. Cl. .......................................... 310/359; 310/366
(58) Field of Search ..................................... 310/358, 359, 310/366, 368

(56) References Cited

U.S. PATENT DOCUMENTS

| 5,440,195 | * | 8/1995 | Ohnishi et al. | 310/359 |
| 5,463,266 | * | 10/1995 | Fukuoka et al. | 310/359 |
| 5,504,384 | * | 4/1996 | Lee et al. | 310/359 |
| 5,576,590 | * | 11/1996 | Ohnishi et al. | 310/359 |
| 5,736,807 | * | 4/1998 | Hamamoto et al. | 310/359 |
| 5,818,150 | * | 10/1998 | Yamamoto et al. | 310/359 |
| 5,872,419 | | 2/1999 | Hall et al. . | |
| 5,903,086 | | 5/1999 | Ogiso et al. . | |
| 5,929,554 | * | 7/1999 | Kanayama et al. | 310/359 |
| 6,051,915 | * | 4/2000 | Katsuno | 310/359 |

FOREIGN PATENT DOCUMENTS

| 0555887 | 8/1993 | (EP) . |
| 0693790 | 1/1996 | (EP) . |
| 0706227 | 4/1996 | (EP) . |
| 6224484 | 8/1994 | (JP) . |
| 6338643 | 12/1994 | (JP) . |
| 7193293 | 7/1995 | (JP) . |
| 08008472 | 1/1996 | (JP) . |
| 837696 | 2/1996 | (JP) . |

OTHER PUBLICATIONS

European Search Report dated Nov. 7, 1997.
International Search Report of PCT/JP97/00207.

* cited by examiner

*Primary Examiner*—Mark O. Budd
(74) *Attorney, Agent, or Firm*—Hopgood, Calimafde, Judlowe & Mondolino, LLP

(57) ABSTRACT

A piezoelectric transformer (21) comprises a piezoelectric rectangular body (23) equally divided into first to fourth regions (A1, A2, A3, and A4) in a longitudinal direction. The first and the fourth regions (A1, A4) are provided with plane electrodes (24, 25, 26, and 27) as input electrodes and polarized in a thickness direction. Strip-like electrodes (30, 31) are formed at the boundary between the remaining second and third regions (A2, A3) as output electrodes. An AC input voltage having a frequency corresponding to a wavelength equal to a half of the length of the piezoelectric rectangular body is applied to the input electrodes to vibrate the piezoelectric plate in a two-wavelength resonance mode. A voltage produced by a piezoelectric effect in response to the vibration is extracted from an output terminal. The transformer is small in size, low in vibration rate and heat generation, and excellent in efficiency. As a modification, the input electrodes may be formed in two or three regions which are opposite to each other in displacement distribution in the two-wavelength resonance without being restricted to the first and the fourth regions while the output electrode is provided in another region.

9 Claims, 6 Drawing Sheets

(a)

(b)

(c)

(a)

(b)

(c)

(d)

PIEZOELECTRIC TRANSFORMER

This application is a con of PCT/JP97/00207 filed Jun. 30, 1997.

TECHNICAL FIELD

This invention relates to a piezoelectric transformer which utilizes a piezoelectric vibrator using a rectangular plate of piezoelectric ceramics.

BACKGROUND ART

As a transformer (voltage transformer), there is well known an electromagnetic transformer comprising windings wound around an iron core. The electromagnetic transformer is unsuitable for use in a power supply for a small-sized electric apparatus because it is bulky in size, is large in power consumption, and generates electromagnetic noise and heat. For example, for use in a high-voltage power supply in an electrostatic generating device or a back-lighting lamp of a liquid-crystal display, the transformer does not require a large output current but requires an output voltage between 1 kV and about several watts. In addition, it is required to reduce the electromagnetic noise, the power consumption, and the size.

On the other hand, since a piezoelectric transformer utilizing a piezoelectric phenomenon generates little electromagnetic noise and can be reduced in size, practical use is considered as a power supply transformer for a small-sized apparatus.

Referring to FIGS. 1(a) and (b), a conventional piezoelectric transformer 11 comprises a piezoelectric-ceramics rectangular plate 13, two surface electrodes 15 and 15 formed on the piezoelectric-ceramics rectangular plate 13 opposite to each other in a thickness direction at a part (hereinafter referred to as a first part) extending from one end to an approximate half in a longitudinal direction, and a plurality of internal electrodes 16 and 17 formed in the interior of the above-mentioned first part between the both surface electrodes with a space kept from one another in the thickness direction. Side electrodes 18 and 19 formed on confronting side surfaces of the above-mentioned first part, respectively, are connected to the surface electrodes 15 and 15, respectively, and to the alternate internal electrodes 16 and the remaining internal electrodes 17, respectively. Moreover, an end electrode 20 for output extraction is formed on the piezoelectric-ceramics rectangular plate 13 over an end surface of a half part (hereinafter referred to as a second part) opposite to the above-mentioned first part.

The above-mentioned first part of the piezoelectric-ceramics rectangular plate 13 is polarized by applying a DC voltage between the side electrodes 18 and 19. Specifically, the piezoelectric-ceramics rectangular plate 13 is polarized between adjacent electrodes of the surface electrodes 15 and 15 and the internal electrodes 16 and 17. The polarization directions are opposite to each other at both sides of each of the internal electrodes 16 and 17, as depicted by small arrows in FIG. 2(b). Furthermore, by applying a DC voltage between the both surface electrodes 15 and the end electrode 20, the second part of the piezoelectric-ceramics rectangular plate 13 is polarized in the longitudinal direction, as depicted by a large arrow in FIG. 1(b).

The above-mentioned type including the plurality of internal electrodes will be referred to as a stacked type because it is actually formed by alternately stacking the internal electrodes and piezoelectric members in manufacture. On the other hand, another type is also known in which the polarization in the thickness direction is only one direction between the confronting surface electrodes 15 and 15 without any internal electrodes formed. This type will be referred to as a single plate type because no stacking is required during manufacture and it is implemented by a single piezoelectric member with electrodes formed on its surfaces.

Description will be made as regards an operation of the piezoelectric transformer illustrated in FIGS. 1(a) and (b). Now, one of the side electrodes 18 and 19 is used as an ground terminal and the other is applied as an input voltage with an AC voltage having a frequency equal to a resonant frequency of the piezoelectric-ceramics rectangular plate 13 in a one-wavelength resonance mode of a longitudinal vibration. Then, the stacked-type piezoelectric transformer acts as a piezoelectric vibrator to vibrate with a displacement distribution and a strain distribution illustrated in FIGS. 2(a) and (b), respectively. At this time, an AC voltage is produced between each of the surface and the internal electrodes 15, 16 and 17 and the end electrode 20 due to the piezoelectric effect. The level of the voltage thus produced is generally determined by distances between adjacent ones of the surface electrodes 15 and the internal electrodes 16 and 17, a distance between the surface electrodes 15 and the end electrode 20, and the input voltage.

Specifically, in the piezoelectric transformer, a transformed voltage can be obtained by energy conversion utilizing the piezoelectric effect, that is, electric-mechanical-electric conversion. In the meanwhile, in the piezoelectric transformer having the above-mentioned transforming system, the thickness of the piezoelectric plate is reduced and/or the thickness between the input electrodes (the surface electrodes and the internal electrodes) is reduced in order to satisfy the demands for low voltage driving, reduction in size, and a large step-up ratio (output voltage/input voltage). As a result, an input impedance is decreased so that an input current (motional current) is increased. The input current is converted into a vibration rate by mechanical conversion. Thus, in case where the vibration rate and an amplitude exceed a vibration level limit (this means the vibration rate at which the temperature ($\Delta T$) of the vibrator reaches a predetermined level due to heat generation at a high vibration rate and a large amplitude; the predetermined level can be selected, for example, as $\Delta T = 25°$ C.) inherent to the used piezoelectric ceramics by the increase of the input current, there arises a disadvantage that the heat generation increases and an efficiency is decreased.

Therefore, in order to solve the above-mentioned drawback in the prior art, it is a technical object of this invention to provide a structure of a piezoelectric transformer which satisfies the demands for low power consumption, low voltage driving, reduction in size, and a large step-up ratio and which is low in vibration rate, small in heat generation, and high in efficiency.

DISCLOSURE OF THE INVENTION

According to this invention, there is provided a piezoelectric transformer comprising a piezoelectric rectangular plate having a plate length extending from a first end to a second end opposite thereto, a plate width, and a plate thickness and comprising four regions virtually divided into quarters along the plate length and continuously arranged from the first end to the second end; input electrode means formed on at least two regions selected as input regions from the four regions to drive two-wavelength resonance of the piezoelectric plate in response to an AC input voltage having a frequency corresponding to a wavelength equal to a half of the plate length; and output electrode means formed at one position of at least one of the remaining regions among the four regions to output an AC output voltage produced from the two-wavelength resonance of the piezoelectric plate; the input regions being polarized in a direction of the plate thickness, the above-mentioned at least one of the remaining regions being polarized in a direction of the plate length.

According to this invention, there is also provided a piezoelectric transformer claimed in each of claims 2 to 11.

According to this invention, the electric voltage having the frequency corresponding to the two-wavelength resonance mode of the piezoelectric rectangular member is applied to the input electrodes to vibrate the piezoelectric rectangular member in the two-wavelength resonance mode. The voltage generated by the vibration as a result of a piezoelectric effect is obtained from an output terminal. As compared with a one-wavelength resonance mode, two times of energy can be extracted from the output side. It is therefore possible to obtain the piezoelectric transformer which is low in vibration rate and in heat generation and excellent in efficiency for the same input current.

BEST MODE FOR CARRYING OUT THE INVENTION

Figure 1:
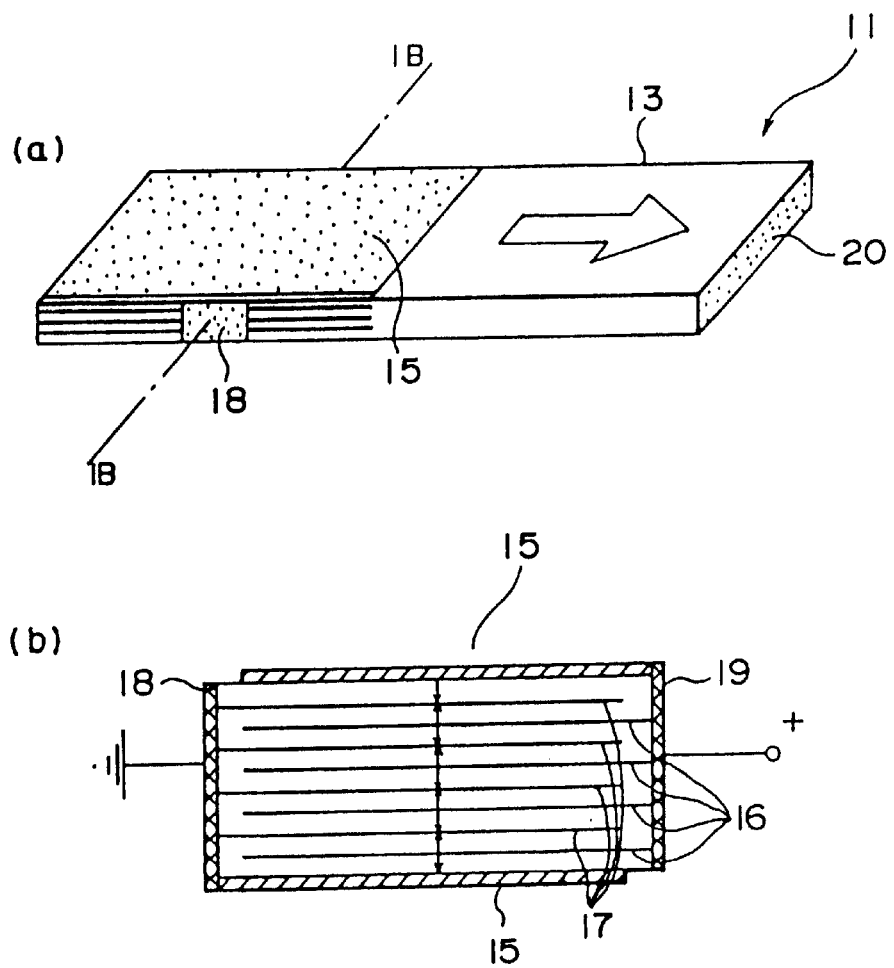
FIG. 1 shows views illustrating a conventional one-wavelength resonance type piezoelectric transformer, (a) being a schematic perspective view, (b) being a sectional view taken along a line 1B—1B in (a).
Figure 2:
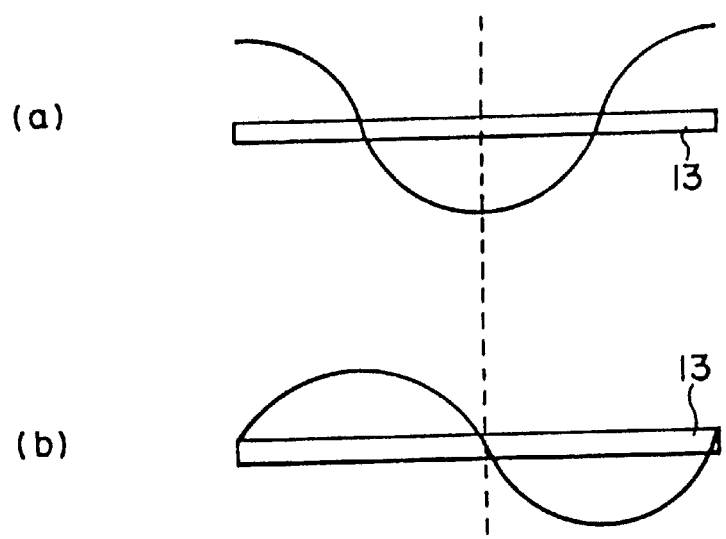
FIGS. 2(a) and (b) show displacement distribution and strain distribution of a piezoelectric-ceramics plate, respectively, when the piezoelectric transformer in FIG. 1 is driven.

Description will be made as regards a piezoelectric transformer according to one embodiment of this invention with reference to the drawing.

Referring to FIGS. 3(a), (b), (c), and (d), a piezoelectric transformer 21 comprises a rectangular plate 23 of piezoelectric ceramics (for example, PZT= lead-zirconate-titanate). Four regions of the piezoelectric-ceramics rectangular plate 23 divided into quarters in its longitudinal direction are assumed to be first to fourth regions A1, A2, A3, and A4 from the lefthand in the figure, respectively. In the first and the fourth regions A1 and A4 at both longitudinal ends, input surface electrodes 24a,25a, 24b, and 25b are formed on surfaces opposite in its thickness direction. Inside these regions, a plurality of internal electrodes 26a, 27a, 26b, and 27b are formed with spaces left therebetween in the thickness direction. Each of the surface electrodes and the internal electrodes is a planar or flat electrode and extends in the longitudinal and the width directions of the rectangular plate 23 in each of the first and the fourth regions but is restricted in each region.

Furthermore, side electrodes 28a, 29a, 28b, and 29b are formed on side surfaces opposite to each other in the width direction. In the first region A1, the surface electrodes 24a and 25a and the internal electrodes 26a and 27a are formed in such a manner that the alternate internal electrodes 26a and the one surface electrode 25a are connected to the side electrode 28a, and the other alternate internal electrodes 27a and the other surface electrode 24a are connected to the side electrode 29a. On the other hand, in the fourth region A4, the surface electrodes 24b and 25b and the internal electrodes 26b and 27b are formed in such a manner that the alternate internal electrodes 26b and the one surface electrode 25b are connected to the side electrode 29b and the other alternate internal electrodes 27b and the other surface electrode 24b are connected to the side electrodes 28b.

The surface electrodes, the internal electrodes, and the side electrodes are used as input electrode means for applying an input voltage to drive the rectangular plate 23 in a two-wavelength resonance mode, as will be described later. The first and the fourth regions A1 and A4 are referred to as input regions because the input electrode means are provided therein.

Moreover, a strip-like surface electrode 30 is formed at a boundary between the second and the third regions A2 and A3 at the center of the piezoelectric-ceramics rectangular plate 23 to surround the rectangular plate 23. A plurality of strip-like internal electrodes 31 are formed inside with spaces left therebetween in the thickness direction. As illustrated in the figure, the strip-like surface electrode comprises portions extending on the upper and the lower surfaces of the rectangular plate 23 and side surface portions connecting those portions. The side surface portions form pad electrodes. Each of the strip-like internal electrodes 31 is formed so that both ends thereof are connected to the inner surfaces of the strip-like surface electrode, more specifically, the inner surfaces of the pad electrodes on the side surfaces. The strip-like surface electrode 30 and the strip-like internal electrodes 31 are used as output electrode means, as will be described later.

The side electrodes 28a and 28b formed on the first and the fourth regions A1 and A4 are connected in common while the side electrodes 29a and 29b are connected in common, and a DC voltage is applied between the both common connections to thereby polarize the above-mentioned first and the fourth regions A1 and A4. As depicted by arrows in FIGS. 3(b) and (c), the polarization directions are opposite to each other at both sides of each internal electrode in the thickness direction. The polarization directions in the lefthand first region A1 shown in FIG. 3(b) are opposite to the polarization directions in the righthand fourth region A4 shown in FIG. 3(c).

The side electrodes 28a and 29a in the first region A1 are connected in common, and a DC voltage is applied between the common connection and the strip-like electrode 30. Thus, the second region A2 is polarized rightward in the longitudinal direction (it is needless to say that the polarization can be done leftward), as depicted by a large arrow in FIG. 3(a). Similarly, the side surface electrodes 28b and 29b in the fourth region A4 are connected in common with the DC voltage applied between them and the strip-like electrode 30. Thus, the third region A3 is polarized rightward in the longitudinal direction, as depicted by a large arrow in FIG. 3(a).

The two side electrodes 28a and 28b at the both sides are connected in common, while the other two side electrodes 29a and 29b at the both sides are connected in common and the AC voltage is applied between both common connections. If its frequency is selected to be a frequency having a wavelength equal to a half of the length of the rectangular plate 23, the rectangular plate 23 vibrates so as to exhibit displacement and strain illustrated in FIGS. 4(a) and (b), respectively. As a result of the vibration, an AC output voltage which is stepped up can be obtained between the output electrode 30 and the electrode 28a, 28b, 29a, or 29b.

Next, description will be made in detail as regards a method of manufacturing the piezoelectric transformer.

First, at predetermined positions on a plurality of piezoelectric-ceramics green sheets of high Qm PZT having a predetermined shape, the internal electrodes 26a and 26b and the strip-like internal electrode 31 are printed as internal electrode patterns by the use of silver-palladium electrode paste. On the other hand, the internal electrodes 27a and 27b and the strip-like internal electrode 31 are also printed on other like piezoelectric-ceramics green sheets. Subsequently, the plurality of those green sheets are alternately stacked and a ceramics green sheet having no electrode patterns is stacked thereon to form a stacked body. Moreover, the stacked body is thermocompression-bonded and sintered in air at 1100° C. for two hours to form a sintered body. Next, projective patterns of the electrode patterns previously formed inside by stacking are formed on the surfaces of the sintered body by the use of silver-palladium paste. The side electrodes for input and the pad-like side electrodes for output connected to the internal electrodes are formed on the side surfaces. In the above-mentioned manner, the surface electrodes 24a, 25a, 24b, 25b, the side electrodes 28a, 29a, 28b, 29b, and the strip-like surface electrode 30 are formed.

The piezoelectric transformer of a single-plate type is formed by simply providing the electrodes on the surfaces without the internal electrodes 26a, 27a, 26b, 27b, and 31. In other words, a plurality of stacked layers are not required (that is, the number of the layer is one).

Figure 3:
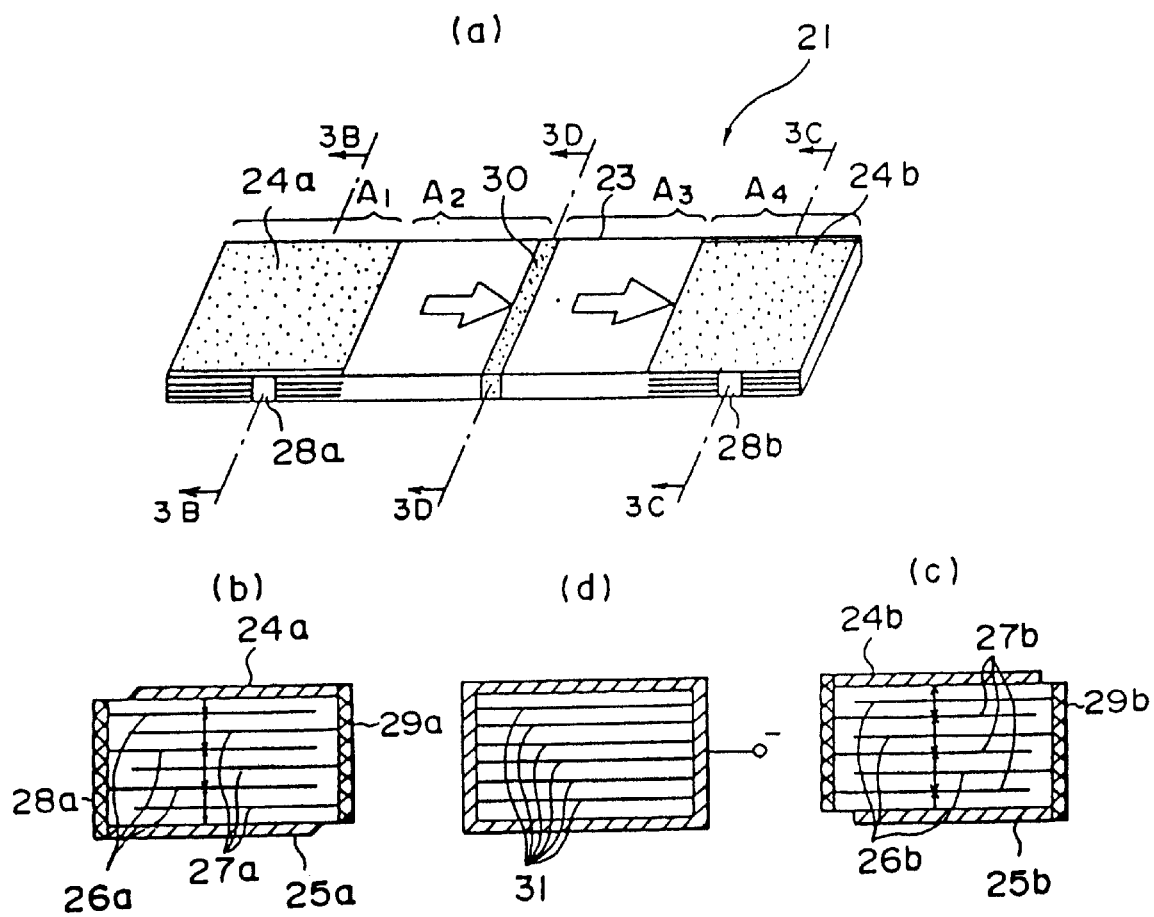
FIG. 3 shows views illustrating a piezoelectric transformer according to one embodiment of this invention, (a) being a schematic perspective view thereof, (b) being a sectional view taken along a line 3B—3B in (a), (c) being a sectional view taken along a line 3C—3C in (a), (d) being a sectional view taken along a line 3D—3D in (a).

The stacked-type piezoelectric transformers of a longitudinal two-wavelength resonance mode having the structure illustrated in FIG. 3 and the piezoelectric transformers of a single-plate type were manufactured to obtain those having a length of 42 mm, a width of 12 mm, and a thickness of 1.5 mm, and others having a width of 6 mm with other dimensions equal to the above. As comparative examples, the conventional stacked-type piezoelectric transformers of a single-wavelength resonance mode of a Lozen type structure illustrated in FIG. 1 and piezolectric vibrators of a 3/2 wavelength resonance mode (a stacked-type piezoelectric transformer of a so-called symmetrical third-order Lozen type) newly proposed in recent years were experimentally manufactured with the like stacked structure at the input side and with the same size. Polarization of these stacked-type piezoelectric transformers was carried out in silicon oil at a temperature of 150° C. under the electric field strength of 1.2 kV/mm.

The piezoelectric transformers manufactured in the above-mentioned manner were subjected to measurement of their characteristics. Table 1 shows the results.

In the stacked-type piezoelectric transformers, the vibration rate has a limit level approximately equal to 0.22 m/s when heat generation ΔT reaches 25° C.

Referring to Table 1, in the comparative examples of the one-wavelength resonance mode, both of the single-plate type and the stacked type are small in heat generation and have the vibration rates which do not reach the limit level, in case of the dimension of 42×12×1.5. However, when the width is reduced to half to decrease the volume of the vibrator (in case of the dimension of 42×6×1.5), the vibration rate exceeds the limit level to reach 0.395 m/s and heat generation leads to 43° C.

Any of types and any of dimensions of comparative examples of the 3/2 wavelength resonance mode provide a low vibration rate (m/s), as compared with those of the one-wavelength resonance mode, and heat generation of 5° C. at maximum.

In case of the stacked-type piezoelectric transformers of the two-wavelength resonance mode of this invention, it is understood that the vibration rate and heat generation ΔT are low for the same output level in any of types and dimensions, as compared with the above-mentioned two kinds of comparative examples. In addition, if the number of the layers is increased, the step-up ratio becomes large. Consequently, lower voltage driving can be realized.

Therefore, the stacked-type piezoelectric transformer of the two-wavelength resonance mode of this invention is excellent in step-up ratio, vibration rate, and heat generation in response to the demand for miniaturization.

Although the surface electrodes are formed on the upper and the lower surfaces of the rectangular plate 23 in the above-mentioned embodiment, the surface electrodes may

TABLE 1

| resonant wavelength | resonant frequency (kHz) | input voltage (rmsV) | output voltage (rmsV) | step-up ratio | vibration rate (m/s) | heat generation ΔT (° C.) | number of layers | size (mm) |
|---|---|---|---|---|---|---|---|---|
| 1 wavelength | 73.5 | 48.5 | 401.2 | 8.27 | 0.200 | 10 | 1 | 42 × 12 × 1.5 |
| | 73.3 | 50.0 | 400.5 | 8.01 | 0.395 | 43 | 1 | 42 × 6 × 1.5 |
| | 73.5 | 9.9 | 400.9 | 40.49 | 0.199 | 10 | 5 | 42 × 12 × 1.5 |
| | 73.3 | 13.5 | 400.5 | 29.60 | 0.395 | 43 | 5 | 42 × 6 × 1.5 |
| 3/2 wavelength | 120.0 | 33.5 | 400.0 | 11.90 | 0.142 | 1 | 1 | 42 × 12 × 1.5 |
| | 116.5 | 53.0 | 399.2 | 7.53 | 0.179 | 5 | 1 | 42 × 6 × 1.5 |
| | 118.6 | 11.5 | 403.4 | 35.00 | 0.143 | 1 | 3 | 42 × 12 × 1.5 |
| | 116.3 | 22.6 | 400.2 | 17.7 | 0.179 | 5 | 4 | 42 × 6 × 1.5 |
| 2 wavelength | 155.1 | 56.0 | 401.6 | 7.17 | 0.085 | 0 | 1 | 42 × 12 × 1.5 |
| | 149.4 | 81.0 | 404.3 | 5.00 | 0.120 | 0.5 | 1 | 42 × 6 × 1.5 |
| | 155.1 | 9.6 | 401.6 | 41.80 | 0.085 | 0 | 6 | 42 × 12 × 1.5 |
| | 149.4 | 10.3 | 402.7 | 39.09 | 0.120 | 0.5 | 8 | 42 × 6 × 1.5 | be omitted, as will be described in following embodiments. Non-use of the surface electrodes is advantageous in insulation of the surface.

Next, referring to FIGS. 5(a), (b), and (c), description will be made as regards another embodiment of this invention.

Like the above-mentioned embodiment, a piezoelectric transformer of this embodiment also comprises the piezoelectric-ceramics rectangular plate 23 provided with the input electrode means and the output electrode means. Like the embodiment in FIG. 3, it is assumed that the piezoelectric-ceramics rectangular plate 23 has regions quartered in its longitudinal direction which are first to the fourth regions A1 to A4 ordered from the lefthand in FIG. 5(a). The piezoelectric transformer of this embodiment is basically different from the piezoelectric transformer of FIG. 3 in that the input electrode means are formed in the second and the third regions A2 and A3 and the output electrode means are formed as end electrodes 32a and 32b on both longitudinal end surfaces of the rectangular plate. More in detail, in this embodiment, the internal electrodes and the side electrodes are formed in the second region A2 and the third region A3 instead of the fourth region A4 and the first region A1 in FIG. 3, respectively. The internal electrodes of the respective regions are depicted at 26a, 27a, 26b, and 27b in FIGS. 5(b) and (c). The side electrodes are formed on both side surfaces, respectively, as depicted by reference numerals 28a, 29a, 26b, and 29b. The surface electrodes 24a to 25b provided as components of the input electrode means in FIG. 3 are not used in this embodiment.

Polarization is carried out in the manner similar to the embodiment of FIG. 3. In the second and the third regions A2 and A3, the polarization is carried out in the thickness direction and oriented as depicted by arrows in FIGS. 5 (b) and (c). Since the surface electrodes are not used in this embodiment, an upper portion of the uppermost internal electrode and a lower portion of the lowermost internal electrode are not polarized.

The first and the fourth regions A1 and A4 between the input electrodes and the output electrodes are polarized rightward in the longitudinal direction, as depicted by large arrows in FIG. 5(a).

Figure 4:
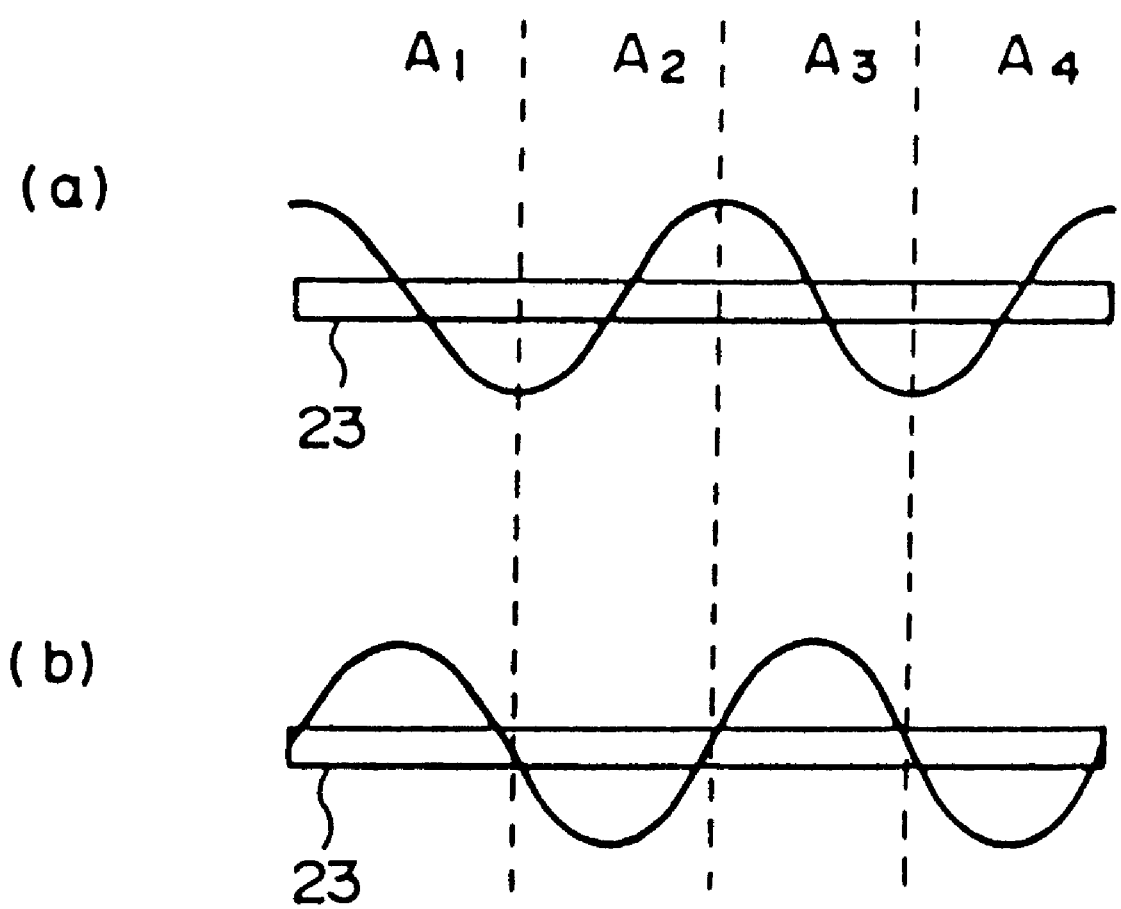
FIGS. 4(a) and (b) show displacement distribution and stress distribution of a piezoelectric-ceramics plate, respectively, when the piezoelectric transformer in FIG. 3 is driven.

In the piezoelectric transformer of this embodiment, when the AC input voltage having a frequency such that two wavelengths correspond to the length of the rectangular plate 23 is applied between the side electrodes 28 and 29, the rectangular plate vibrates by the piezoelectric effect with the displacement distribution and the stress distribution illustrated in FIGS. 4(a) and (b). As a result of the vibration, an output voltage can be obtained between the end electrodes 32a and 32b due to the piezoelectric effect.

The piezoelectric transformer of this embodiment is manufactured in the manner similar to the manufacturing method of the embodiment of FIG. 3. The differences therebetween reside in that the electrode patterns for the internal electrodes are formed at different positions on the green sheets, that additional stacking of a green sheet without any electrode pattern is not required after forming the stacked structure, that surface electrodes need not be formed after sintering, that the side electrodes are formed at different positions, and that the end electrodes are formed as the output electrodes.

A piezoelectric transformer element according to this embodiment was manufactured. The sintering condition was at 1100° C. for two hours. The polarization condition was in silicon oil kept at 150° C. under the electric field strength of 1 kV/mm for fifteen minutes. In order to evaluate the characteristics, the piezoelectric transformer thus obtained was driven by applying a sine wave input voltage thereto using as a load a cold-cathode tube having a diameter of 2.2 mm and a length of 220 mm. In this state, the step-up characteristic and the relationship between the vibration rate and the heat generation during stable lighting were measured. Table 2 shows the result of measurement.

For the purpose of comparison, the Lozen type piezoelectric transformer of the conventional structure having the same size and the same number of layers was manufactured under the similar sintering and polarization conditions and subjected to the same evaluation test. The result is shown in the same Table 2.

TABLE 2

| | Lozen type | present invention |
|---|---|---|
| dimension (mm) | 42 × 6 × 1.5 | 42 × 3 × 1.5 |
| resonant frequency (kHz) | 78 | 150 |
| number of layers | 6 | 5 |
| input voltage (Vpp) | 18 | 24 |
| tube current (mA) | 5 | 5 |
| step-up ratio | 50 | 45 |
| vibration rate (m/s) | 0.38 | 0.15 |
| heat generation ΔT (° C.) | 65 | 8 |
| efficiency (%) | 80 | 84 |

Referring to Table 2, in the conventional piezoelectric transformer, the vibration rate is 0.38 m/s and the heat generation is as high as 65° C. However, in the piezoelectric transformer of this invention, the vibration rate and the heat generation quantity ΔT are low for the same output (tube current) so that the efficiency is more excellent, although the step-up ratio is equal to 45 and slightly low.

Description will be made about still another embodiment of this invention with reference to FIGS. 6(a) to (d).

As apparent from comparison of these figures with FIGS. 3(a) to (d), the surface electrodes are removed from the structure of the piezoelectric transformer illustrated in FIG. 3(a) while the second region A2 of the piezoelectric-ceramics rectangular plate 23 is additionally provided with the internal electrodes and the side electrodes of the structure similar to those formed in the fourth region A4. Specifically, the first, the second, and the fourth regions A1, A2, and A4 serve as the input regions. The strip-like internal electrode as the output electrode means is formed at the center of the third region A3.

In the figures, the internal electrodes and the side electrodes of the first, the second, and the fourth regions A1, A2, and A4 are depicted by the same reference numerals as those used in FIG. 3 but with subscripts a, b, and c added thereto, respectively. The internal electrodes and the side electrodes of the first, the second, and the fourth regions A1, A2, and A4 form as the input electrode means. The strip-like internal electrodes as the output electrode means are depicted by the same reference numeral as that used in FIG. 3. Pad-like side surface electrodes 34 and 35 are formed as external electrodes.

In the piezoelectric transformer of this embodiment, polarization is carried out in the manner similar to the embodiment of FIG. 3. The first and the second regions A1 and A2 are polarized as depicted by arrows in FIGS. 6(b) and (c), respectively, while the fourth region A4 is polarized as illustrated in FIG. 6(c), like the second region A2. The third region A3 is polarized in the longitudinal direction towards the output electrode at the center, as depicted by arrows in FIG. 6(a).

In the piezoelectric transformer, the side electrodes 28a, 28b, and 28c are connected in common while the side electrodes 29a, 29b, and 29c are connected in common, and between the common connections, the AC input voltage is applied which has a frequency such that two wavelengths correspond to the length of the rectangular plate 23. Consequently, the rectangular plate vibrates due to the piezoelectric effect with the displacement distribution and the stress distribution illustrated in FIGS. 4(a) and (b), respectively. As a result of the vibration, the output voltage is generated due to the piezoelectric effect at the side electrodes 34 and 35. The output voltage is obtained as a voltage between one of the side electrode 34 and 35 for the output electrodes and one of the side electrodes 28a, 28b, 28c, 29a, 29b, and 29c for the input electrodes (may be grounded to be used as an ground terminal for input and output in common).

The piezoelectric transformer of this embodiment is manufactured like the manufacturing method of the embodiment of FIG. 3. The differences therebetween reside in that an increased number of electrode patterns for the internal electrodes are formed on the green sheet, that the output strip-like electrodes are formed at a different position, that additional stacking of a green sheet without any electrode pattern is not required after forming the stacked structure, that the surface electrodes need not be formed after sintering, that the number of the side electrodes is different, and that the side electrodes are formed as the output electrodes.

A piezoelectric transformer element according to this embodiment was manufactured. The sintering condition was at 1100° C. for two hours. The polarization condition was in silicon oil kept at 150° C. under the electric field strength of 1 kV/mm for fifteen minutes. In order to evaluate the characteristics, the piezoelectric transformer thus obtained was subjected to the evaluation test similar to that described in conjunction with the embodiment of FIG. 5. Table 3 shows the result.

For the purpose of comparison, the Lozen type piezoelectric transformer of the conventional structure having the same size and the same number of layers was manufactured under the similar sintering and polarization conditions and subjected to the same evaluation test. The result is shown in the same Table 3.

TABLE 3

|  | Lozen type | present invention |
| --- | --- | --- |
| resonant frequency (kHz) | 78 | 155 |
| device dimension (mm) | 42 × 6 × 1.5 | 42 × 3 × 1.5 |
| number of layers | 6 | 6 |
| input voltage (Vpp) | 18 | 15 |
| tube current (mA) | 5 | 5 |
| step-up ratio | 50 | 60 |
| vibration rate (m/S) | 0.38 | 0.2 |
| heat generation ΔT (° C.) | 40 | 25 |
| efficiency (%) | 80 | 84 |

As apparent from Table 3, the piezoelectric transformer of this embodiment is not inferior in step-up ratio and has a low vibration rate for the same output (tube current) so that the heat generation quantity is small although the volume is half, as compared with the conventional Lozen type piezoelectric transformer.

Referring to FIGS. 7(a) to (d), description will be made about still another embodiment of this invention.

Figure 6:
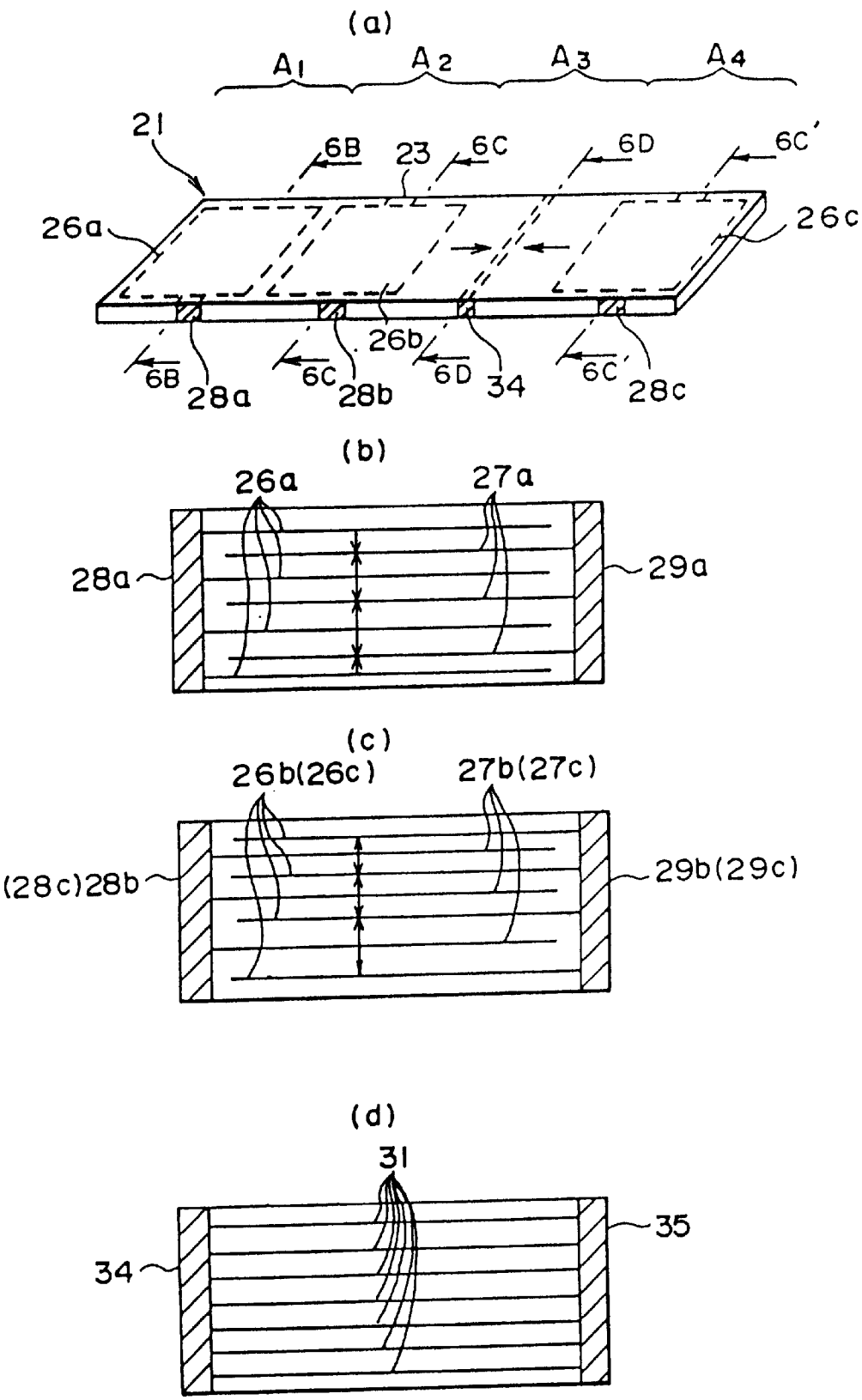
FIG. 6 shows views illustrating a piezoelectric transformer according to another embodiment of this invention, (a) being a schematic perspective view thereof, (b), (c), and (d) being sectional views taken along a line 6B—6B, a line 6C—6C, and a line 6D—6D in (a), respectively. The section taken along a line 6C'—6C' in (a) is similar to (c).

A piezoelectric transformer of this embodiment has a structure substantially similar to that of the embodiment of FIG. 6 except that the internal electrodes and the side electrodes in the fourth region A4 are removed. Specifically, it is different in that only the first and the second regions A1 and A2 serve as the input regions. Furthermore, the strip-like internal electrodes and the side surface electrodes therefor as the output electrode means are moved to the boundary between the third and the fourth regions A3 and A4. Moreover, a grounding end electrode 32 is formed on the end surface of the fourth region as an output ground electrode terminal.

Therefore, the first and the second regions A1 and A2 are polarized in the manner similar to FIGS. 6(b) and (c), as depicted in FIGS. 7(b) and (c) while the third and the fourth regions A3 and A4 are polarized in the longitudinal direction towards the strip-like electrode as the output electrodes and the end electrode, respectively.

In the piezoelectric transformer, the side electrodes 28a and 28b are connected in common while the side electrodes 29a and 29b are connected in common. Between the common connections, the AC input voltage is applied which has a frequency such that two wavelengths correspond to the length of the rectangular plate 23. Consequently, the rectangular plate vibrates due to the piezoelectric effect with the displacement distribution and the stress distribution illustrated in FIGS. 4(a) and (b), respectively. As a result of the vibration, the output voltage is produced due to the piezoelectric effect at the side electrodes 34 and 35 for output. The output voltage can be obtained as a voltage between the side electrode 34 or 35 and the end electrode 32.

The manufacturing method is substantially similar to that mentioned in the embodiment of FIG. 6. The differences resides in that the internal electrode patterns in the third region are not formed upon stacking, that the strip-like internal electrode patterns for output are formed at different positions, and that the side electrodes and the end electrode for output are formed after sintering.

TABLE 4

|  | Lozen type | present invention |
| --- | --- | --- |
| resonant frequency (kHz) | 78 | 155 |
| device dimension (mm) | 42 × 6 × 1.5 | 42 × 3 × 1.5 |
| number of layers | 6 | 5 |
| input voltage (Vpp) | 18 | 28 |
| tube current (mA) | 5 | 5 |
| step-up ratio | 50 | 45 |
| vibration rate (m/s) | 0.38 | 0.2 |
| heat generation ΔT (° C.) | 40 | 25 |
| efficiency (%) | 80 | 84 |

Figure 7:
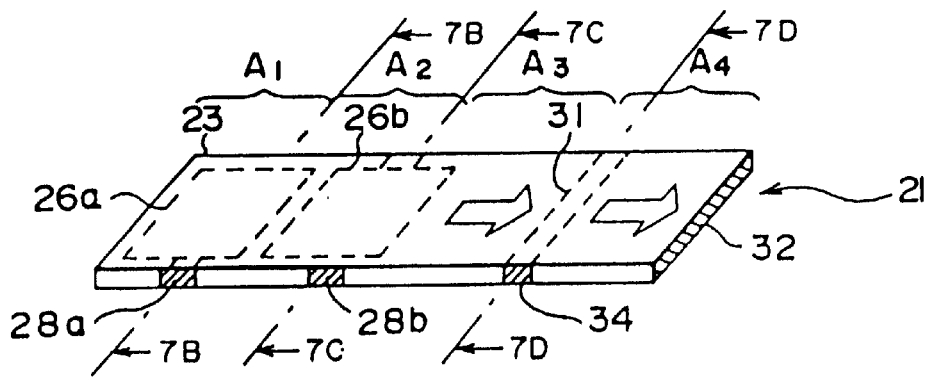
FIG. 7 shows views illustrating a piezoelectric transformer according to another embodiment of this invention, (a) being a schematic perspective view thereof, (b), (c), and (d) being sectional views taken along a line 7B—7B, a line 7C—7C, and a line 7D—7D in (a), respectively.
Figure 7:
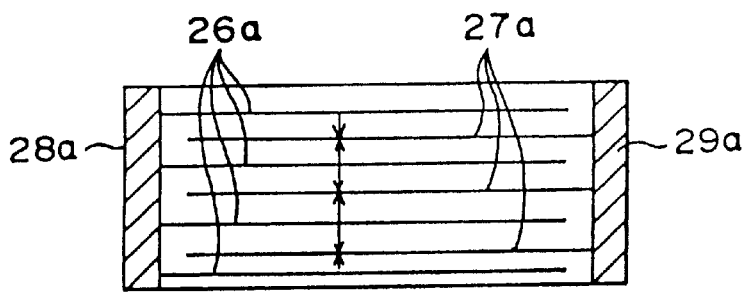
Figure 7:
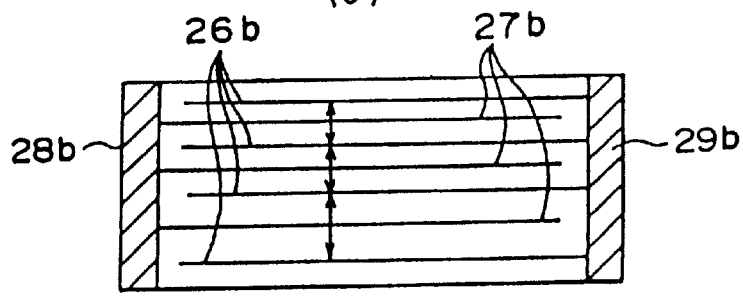
Figure 7:
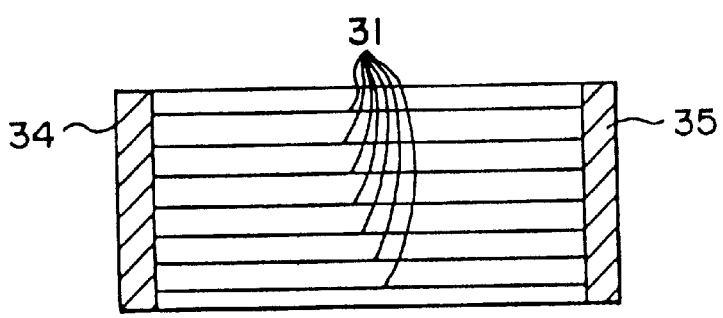

The piezoelectric transformer of the embodiment of FIG. 7 was manufactured. The polarization condition and the sintering condition were similar to those in the embodiment of FIG. 6.

Figure 5:
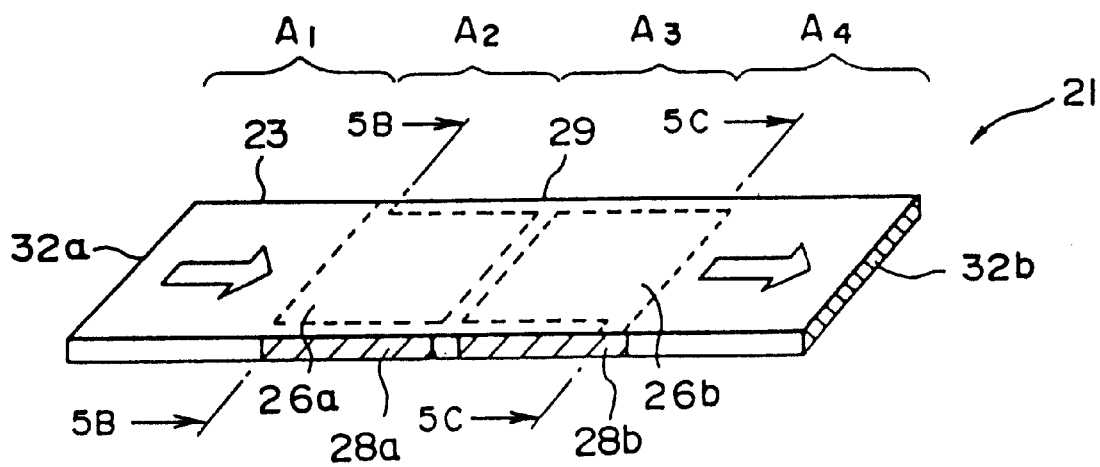
FIG. 5 shows views illustrating a piezoelectric transformer according to another embodiment of this invention, (a) being a schematic perspective view thereof, (b) and (c) being sectional views taken along a line 5B—5B and a line 5C—5C in (a), respectively.
Figure 5:
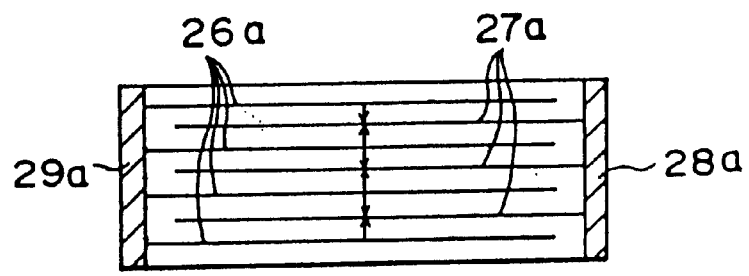
Figure 5:
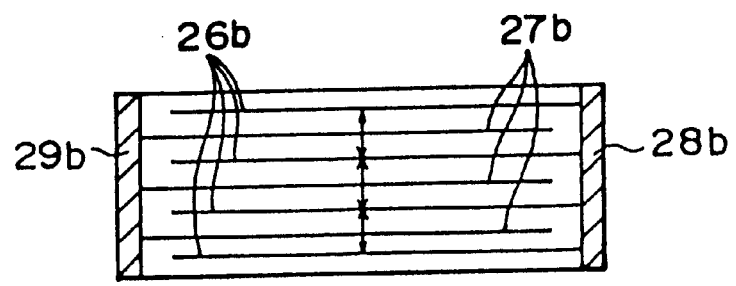

In order to evaluate the characteristic, the piezoelectric transformer thus manufactured was subjected to the evaluation test similar to that mentioned in the embodiment of FIG. 5. Table 4 shows the result.

For the purpose of comparison, the Lozen type piezoelectric transformer of the conventional structure having the same size and the same number of layers was manufactured under the similar sintering and polarization conditions and subjected to the same evaluation test. The result is shown in the same Table 4.

It is understood from Table 4 that, as compared with the conventional Lozen type, the piezoelectric transformer of this invention has a low vibration rate for the same output (tube current) even with a half volume so that the heat generation quantity is reduced, although the step-up ratio was slightly small.

In the embodiments of FIG. 5 and FIG. 6, the surface electrode is not used. However, it is possible to additionally provide the surface electrode, like the embodiment of FIG. 3. By using the surface electrode, the region provided with the input electrode is polarized throughout its entirety in the thickness direction to contribute to the vibration. Accordingly, this structure is advantageous in view of the output. In case where the surface electrode is used, it is also possible to form as the single plate type structure provided with the surface electrode alone without using the internal electrodes, as described in conjunction with the embodiment of FIG. 3.

Although the PZT ceramics plate is exemplified as the piezoelectric plate, use may be made of any other material having a piezoelectric characteristic. Moreover, although the silver-palladium thin film formed by printing is exemplified as the electrode, any other conductive thin film can be used.

In the foregoing, description has been made as regards the several embodiments of this invention. It will be understood here that this invention is not restricted to those embodiments and can be implemented in various other manners without the scope of this invention.

Industrial Applicability

As described above, according to this invention, it is possible to obtain a high-efficiency piezoelectric transformer which has a low vibration rate and small heat generation for the same output power even with a half volume as compared with the conventional Lozen type piezoelectric transformer and, in particular, to provide a piezoelectric transformer adapted for use in a back-lighting power supply for a liquid-crystal display.

What is claimed is:

1. A piezoelectric transformer comprising:
    a piezoelectric rectangular plate having a plate length extending from a first end to a second end opposite thereto, a plate width, and a plate thickness and comprising first through fourth regions by dividing said plate into quarters along said plate length and said four regions being continuously arranged from said first end to said second end, said piezoelectric plate having side surfaces confronting each other in said plate width direction;
    input electrode formed on two regions selected as input regions from said first through said fourth regions suitable for being applied with an AC input voltage having a frequency corresponding to a wavelength equal to half of said plate length to drive two-wavelength resonance of said piezoelectric plate, said input regions being polarized in a direction of plate thickness, the remaining two regions of said first through said fourth regions adjoining each other and being polarized in a same direction of the plate length, said input electrodes comprising:
        a plurality of plane electrodes formed in each of said input regions and extending in said plate length direction and said plate width direction but within said input region, and being of the stacked type, and spaced from one another in said plate thickness direction; and
        two side electrodes formed on said confronting side surfaces of each of said input regions to be applied with said AC input voltage, one of said two side electrodes being connected to one of every two adjacent ones of said plane electrodes while the other side electrode is connected to the other of every two adjacent ones of said plane electrodes; and
    output electrodes formed at the boundary between said remaining two regions for outputting an AC output voltage produced from the two-wavelength resonance of said piezoelectric plate.

2. A piezoelectric transformer as claimed in claim 1, wherein each of said input regions is polarized between every two adjacent ones of said plane electrodes by preliminary applying a DC voltage to said two side electrodes such that the polarization directions are opposite to each other at both sides of each of said plane electrodes.

3. A piezoelectric transformer as claimed in claim 2, wherein said plane electrodes are embedded in said piezoelectric plate as internal electrodes.

4. A piezoelectric transformer as claimed in claim 2, wherein said piezoelectric plate has upper and lower surfaces confronting each other in said plate thickness direction, and two of said plane electrodes are formed on said upper and said lower surfaces in each of said input regions while the remaining plane electrodes are embedded in said piezoelectric plate as internal electrodes.

5. A piezoelectric transformer as claimed in claim 1, wherein said output electrodes comprise:
    a plurality of strip-like electrodes extending in said plate width direction and spaced from one another in said plate thickness direction; and
    two output side electrode pads formed on said confronting side surfaces and connected to both ends of said strip-like electrodes, to extract said AC output voltage.

6. A piezoelectric transformer as claimed in claim 5, wherein said strip-like electrodes are embedded in said piezoelectric plate as internal strip-like electrodes.

7. A piezoelectric transformer as claimed in claim 5, wherein two of said strip-like electrodes are formed on said upper and said lower surfaces, respectively, while the remaining strip-like electrodes are embedded in said piezoelectric plate as internal strip-like electrodes.

8. A piezoelectric transformer as claimed in claim 1, wherein said first through said fourth regions are arranged from said first end towards said second end in said plate length direction in this order, and said input regions are said first and said fourth regions adjacent to said first and said second ends, respectively, said first and said fourth regions being polarized opposite to each other.

9. A piezoelectric transformer as claimed in claim 1, wherein said first through said fourth regions are arranged from said first end towards said second end in said plate length direction in this order, said input regions are said first and said second regions adjacent to each other, said first and said second regions being polarized opposite to each other, and an output ground electrodes are formed on said second end.

* * * * *